United States Patent [19]
Hwang

[11] Patent Number: 5,440,269
[45] Date of Patent: Aug. 8, 1995

[54] DIGITAL FM DEMODULATOR HAVING AN ADDRESS CIRCUIT FOR A LOOKUP TABLE

[75] Inventor: Deog-won Hwang, Seoul, Rep. of Korea

[73] Assignee: Samsung Electronics Co., Ltd., Kyungki-do, Rep. of Korea

[21] Appl. No.: 302,212

[22] Filed: Sep. 8, 1994

[30] Foreign Application Priority Data

Sep. 8, 1993 [KR] Rep. of Korea .................. 93-18014

[51] Int. Cl.$^6$ .................................................. H03D 3/02
[52] U.S. Cl. .................................. 329/318; 329/320; 329/336; 329/341; 375/324; 455/214
[58] Field of Search ............... 329/318, 320, 336, 341, 329/342, 343; 375/80; 455/214

[56] References Cited

U.S. PATENT DOCUMENTS

4,862,099  8/1989  Nakai et al. ..................... 329/341
4,994,754  2/1991  Ohta .................................. 329/318

Primary Examiner—Siegfried H. Grimm
Attorney, Agent, or Firm—Sughrue, Mion, Zinn, Macpeak & Seas

[57] ABSTRACT

In a digital frequency demodulator, data representing the input signal to be demodulated is prestored in a look-up table and signal processing is digitally performed to generate a read address required for reading out the data stored in the look-up table using a phase shift method of operation. Phase-shifting is performed by determining the slope of a frequency-modulated signal containing a signal which does not cross the zero axis. Thus, the precision of the frequency demodulation is enhanced, and the frequency demodulation data stored in the look-up table is minimized to reduce the size of a ROM used for the look-up table. The digital frequency demodulator includes a look-up table for storing frequency demodulation data, an address generating circuit for comparing the magnitude of the absolute value of frequency modulated signal and a phase-shifted version thereof so as to generate address information for the look-up table and a comparison signal, a circuit for determining the slopes of the frequency-modulated and phase-shifted signals and, responsive thereto, generating slope determination signals, and a phase compensator for operating on the output from the look-up table in response to the slope determination signals and the comparison signal to thereby expand the phase value output from the look-up table. A method for operating a digital frequency demodulator is also revealed.

15 Claims, 5 Drawing Sheets

| ABSOLUTE VALUE COMPARISON | SLOPE | | PHASE COMPENSATION |
|---|---|---|---|
| $|\sin|<|\cos|$ | $\sin>0$ | $\cos>0$ | $2\pi - \tan^{-1}\left(\left|\frac{\sin\theta}{\cos\theta}\right|\right)$ |
| $|\sin|>|\cos|$ | $\sin>0$ | $\cos>0$ | $\frac{3\pi}{2} + \tan^{-1}\left(\left|\frac{\cos\theta}{\sin\theta}\right|\right)$ |
| $|\sin|>|\cos|$ | $\sin<0$ | $\cos>0$ | $\frac{3\pi}{2} - \tan^{-1}\left(\left|\frac{\cos\theta}{\sin\theta}\right|\right)$ |
| $|\sin|<|\cos|$ | $\sin<0$ | $\cos>0$ | $\pi + \tan^{-1}\left(\left|\frac{\sin\theta}{\cos\theta}\right|\right)$ |
| $|\sin|<|\cos|$ | $\sin<0$ | $\cos<0$ | $\pi - \tan^{-1}\left(\left|\frac{\sin\theta}{\cos\theta}\right|\right)$ |
| $|\sin|>|\cos|$ | $\sin<0$ | $\cos<0$ | $\frac{\pi}{2} + \tan^{-1}\left(\left|\frac{\cos\theta}{\sin\theta}\right|\right)$ |
| $|\sin|>|\cos|$ | $\sin>0$ | $\cos<0$ | $\frac{\pi}{2} - \tan^{-1}\left(\left|\frac{\cos\theta}{\sin\theta}\right|\right)$ |
| $|\sin|<|\cos|$ | $\sin>0$ | $\cos<0$ | $\tan^{-1}\left(\left|\frac{\sin\theta}{\cos\theta}\right|\right)$ |

DIGITAL FM DEMODULATOR HAVING AN ADDRESS CIRCUIT FOR A LOOKUP TABLE

BACKGROUND OF THE INVENTION

1. Field of the Invention

The present invention relates to a frequency demodulator and, more specifically, to a digital frequency demodulator for performing digital demodulation using a phase shift mode of operation. A corresponding method is also disclosed.

The present application is based on Korean Patent Application No. 93-18014, which is incorporated herein by reference for all purposes.

2. Brief Discussion of Related Art

In general, a frequency demodulator is used to restore a signal, which was frequency-modulated for transmission, back into the original signal, i.e., before transmission. Frequency demodulation has been conventionally carried out in an analog mode of operation. However, due to the inherent characteristics of the analog circuit components, the signal-to-noise (S/N) ratio of a demodulated signal is generally lower, as is the linearity, sensitivity and stability of the system.

Figure 1:
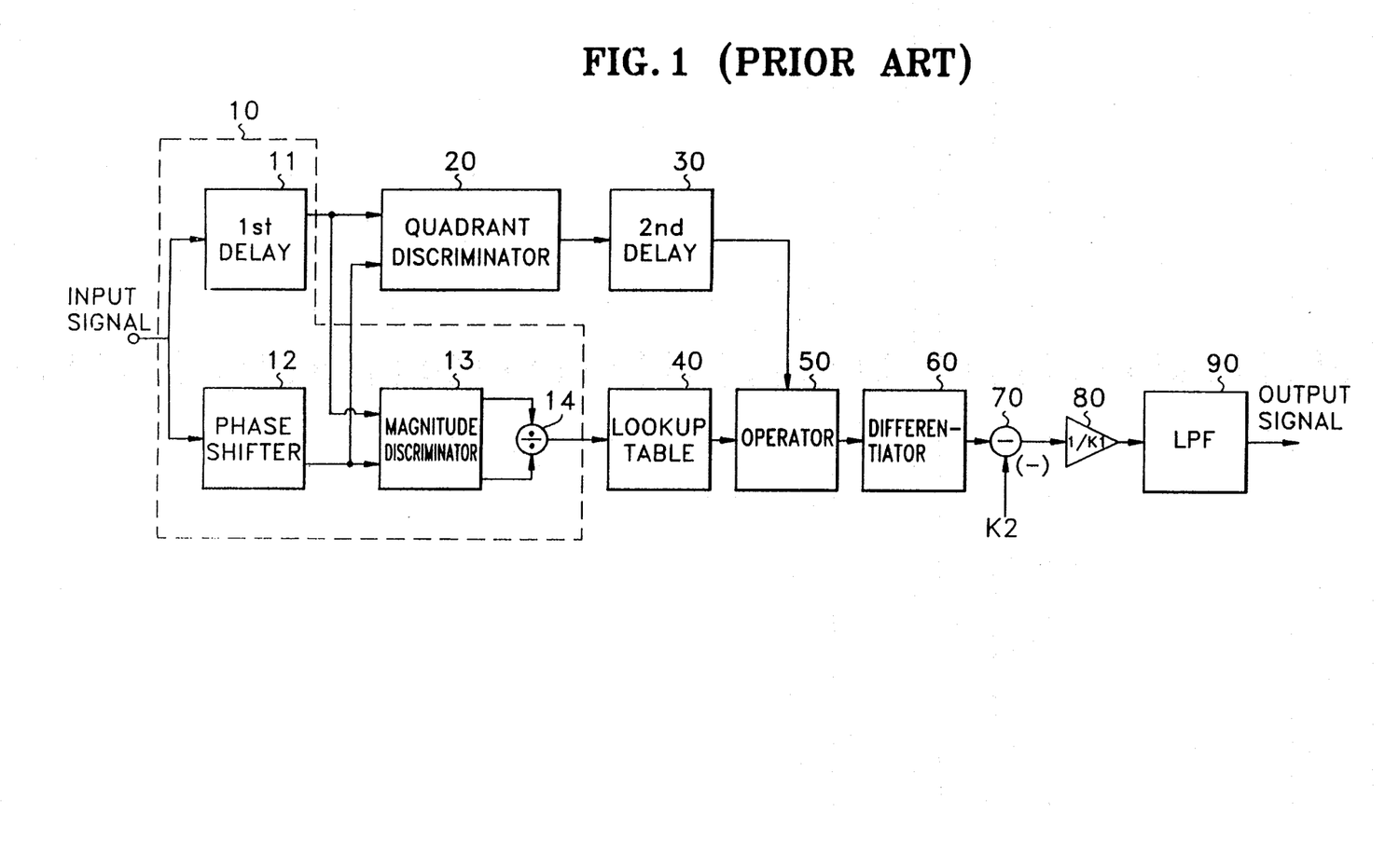
FIG. 1 is a block diagram of a conventional digital frequency demodulator.

In order to overcome such problems with analog frequency demodulation, a conventional digital frequency demodulator has been proposed, as shown in FIG. 1. Prior to the description of the conventional digital frequency demodulator of FIG. 1, a brief discussion of analog frequency modulation will be provided.

Basically, frequency modulation varies a carrier frequency in accordance with a modulation signal. In an exemplary case, fixed data corresponding to the carrier frequency is added to data in which a frequency deviation constant is multiplied by a video signal, so as to obtain data corresponding to an instant frequency. If this data is integrated, the data indicates an instant phase. That is, when the data is normalized for a period of $2\pi$, a predetermined angle change occurs to its phase during one clock period and then a signal corresponding to the magnitude of the angle is output. This signal is the frequency-modulated signal.

This process can be expressed using equation (1):

$$Y_{FM}(t) = A\sin\left[\omega_C t + D_\omega \int_0^t x(t) + \theta\right] \quad (1)$$

where A is the amplitude of an information signal (the modulating signal); $\omega_C$ is the carrier frequency; $D\omega$ is frequency deviation angular velocity; $\theta$ is the initial phase; and x(t) is the information signal.

If equation (1) is changed into an equation which is sampled over a period T, equation (2) follows thus:

$$\begin{aligned}Y_{FM}(nT) &= A\sin\left[\omega_C nT + D_\omega \sum_{i=0}^{n-1} x(iT)dt + \theta\right] \\ &= A\sin\left[2\pi\left\{\sum_{i=0}^{n-1} (f_C T + x(iT)D_f T)\right\}\right] \\ &= A\sin\left[2\pi\left\{\sum_{i=0}^{n-1} (K2 + x(iT)K1)\right\}\right]\end{aligned} \quad (2)$$

where $\theta$ is zero; K2 is equal to $f_C T$, which determines the carrier frequency; and K1 is equal to $D_f T$, which is a factor for determining the frequency deviation.

Frequency demodulation for restoring the FM signal to its original form is carried out as follows.

First, by substituting $\Phi$ for the bracketed expression of equation (2), we get $$Y_{FM}(nT) = A\sin\Phi \quad (3)$$

and solving for $\Phi$ in equation (3), $$\tan\Phi = \frac{\sin\Phi}{\cos\Phi} \quad (4)$$

which may be expressed in terms of X and Y as $$\Phi = \tan^{-1}\left[\frac{X}{Y}\right] \quad (5)$$

or $$\frac{d\Phi}{dt} = 2\pi(K2 + x(iT)K1) \quad (6)$$

Therefore, in order to restore the frequency modulated signal into the original signal as shown in equations (4), (5) and (6), the conventional frequency demodulator of FIG. 1 will be explained below.

An input signal in the form of a sine wave is applied to, a phase shifter 12, which delays the input signal for $-\pi/2$ so as to output a cosine wave. Simultaneously, a first delay 11 delays the applied sine wave for a predetermined time, e.g., the processing time in phase shifter 12, so that the cosine wave, i.e., the input signal, phase-shifted by 90°, from the phase shifter 12 is output at the same time as the sine wave from the first delay 11. A magnitude discriminator 13 compares the magnitude of the absolute value of the sine wave output from first delay 11 and the magnitude of the absolute value of the cosine wave output from phase shifter 12. Based on this comparison, if the absolute value of the cosine wave is greater than or equal to that of the sine wave, a divider 14 produces a tangent form of the input signal, as an address signal. When the absolute value is less than that of the sine wave, the cotangent form is output as the address signal. Look-up table 40 reads out and outputs a signal corresponding to the address signal output from divider 14.

Meanwhile, a quadrant discriminator 20 detects the signs of the applied sine and cosine waves in order to discriminate the quadrant of the signal being demodulated. Then, a second delay 30 delays the quadrant discriminating signal output from quadrant discriminator 20 for a time equal to the time during which data is read out from look-up table 40.

An operating device 50 operates on the signal output from look-up table 40 according to the quadrant discriminating signal output from second delay 30. A differentiator 60 then differentiates the signal output from operating device 50 so as to restore the signal integrated during the frequency modulation. A subtractor 70 subtracts a carrier frequency K2 from the signal output from differentiator 50 so as to cancel the carrier frequency from the signal output from differentiator 50 and output a signal without the K2 component. Then, a multiplier 80 multiplies the applied signal by 1/K1, thereby canceling the frequency deviation determining component K1. Finally, a low-pass filter 90 removes the high frequency component of the restored signal and outputs the frequency demodulated signal.

Figure 2:
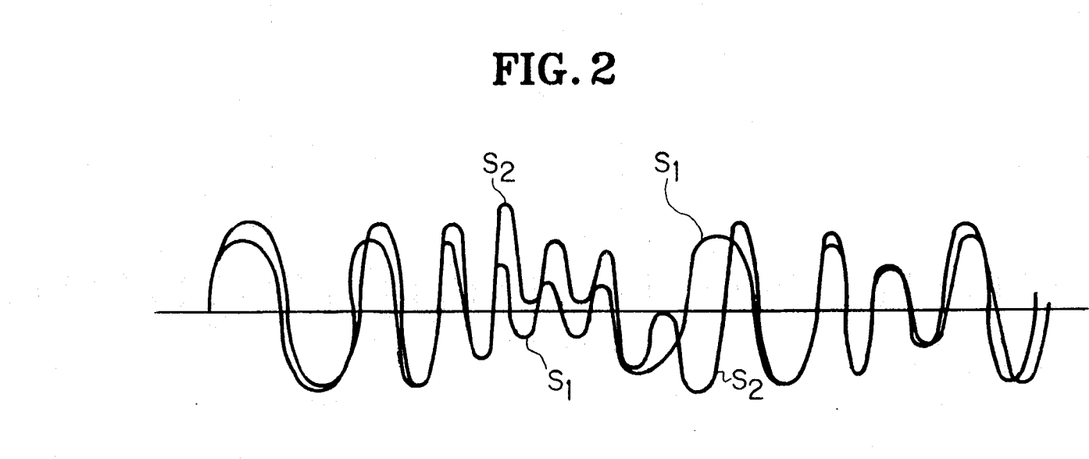
FIG. 2 illustrate a waveform of an original signal and of a frequency modulated signal which has been unfaithfully reproduced from a head.

In the conventional digital frequency demodulator shown in FIG. 1, since a signal, which is generated when the high frequency component of a frequency-modulated signal is not faithfully reproduced by a head, is applied as the input and demodulated, a black-and-white inversion phenomenon occurs on the screen, as illustrated in FIG. 2. In FIG. 2, the original signal $S_1$ is overlaid on the reproduced signal $S_2$. It will be noted that black-and-white inversion in the central region of FIG. 2.

SUMMARY OF THE INVENTION

The principal object of the present invention is to provide a digital frequency demodulator for outputting frequency demodulation data prestored in a look-up table and discriminating the slope degree of a frequency modulated signal containing a signal which does not pass the zero axis, using a phase shift method of operation.

This and other objects, features and advantages according to the present invention are provided by a frequency demodulator for restoring a signal which has been frequency-modulated in order to perform a write operation or transmission. The frequency demodulator advantageously includes:

a look-up table for storing frequency demodulation data used to output a phase value which is shifted according to the change of the frequency-modulated signal;

an address generating circuit for phase-shifting the frequency-modulated signal by a predetermined angle and comparing the magnitude of the absolute value of the phase-shied signal and the magnitude of the absolute value of the frequency-modulated signal so as to generate address information for the look-up table;

a slope discriminator for discriminating the slopes of the phase-shifted signal and frequency-modulated signal and for outputting a slope discriminating signal in accordance therewith;

a phase compensator for operating on the phase value output from the look-up table using a predetermined phase value according to the slope discriminating signal and the comparison result of the magnitude of the absolute value of the phase-shifted signal of the address generating circuit and the magnitude of the absolute value of the frequency-modulated signal, so as to expand the phase value output from the look-up table;

a differentiator for differentiating the signal output from the phase compensator;

a subtractor for subtracting a carrier-frequency-determining component from the signal output from the differentiator so as to cancel the carrier component from the signal output from the differentiator; and a multiplier for multiplying the signal output from the subtractor by the reciprocal of a frequency-deviation-determining component, to thereby cancel the frequency-deviation-determining component.

Figure 3:
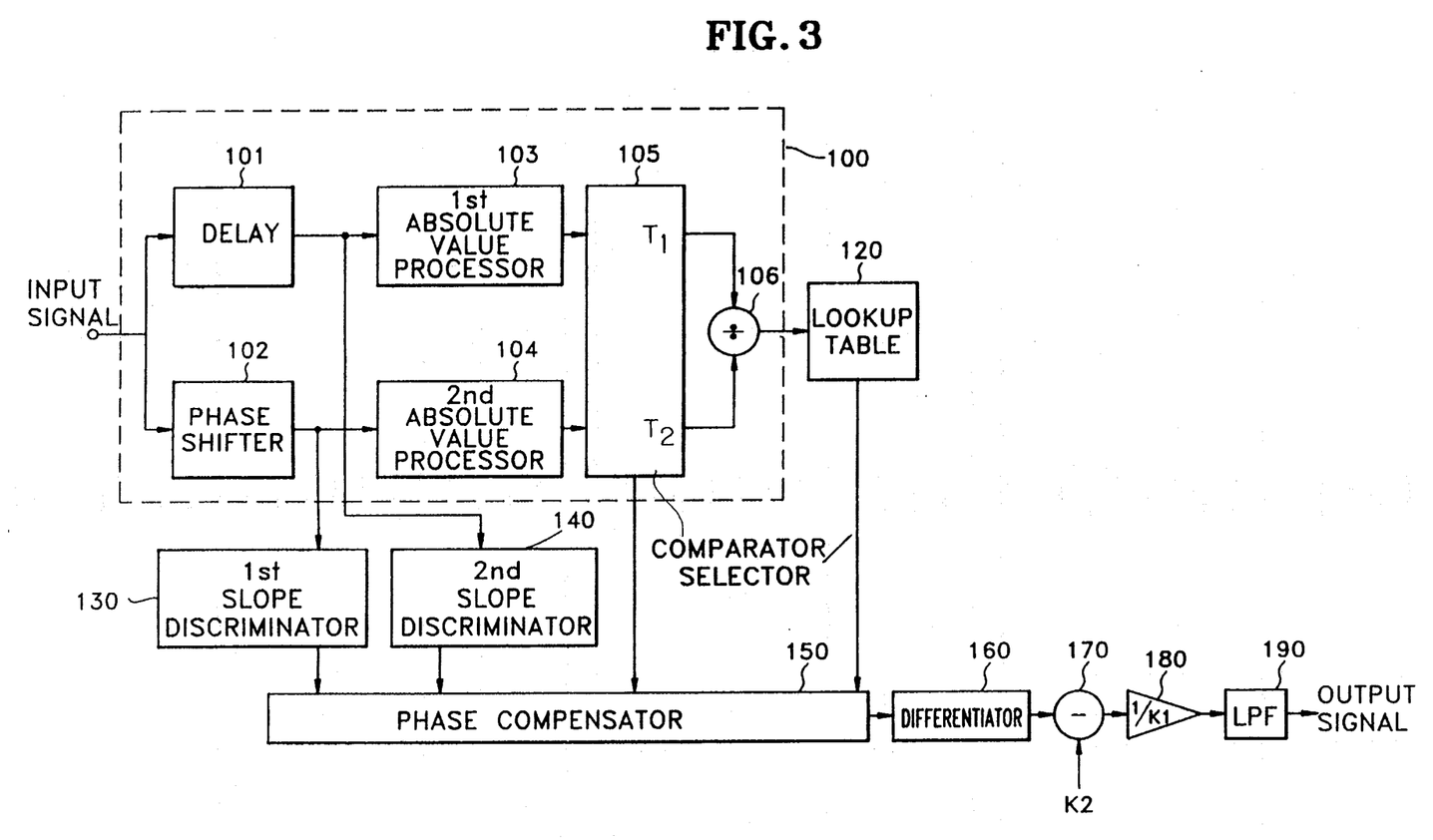
FIG. 3 is a block diagram of one embodiment of a digital frequency demodulator of the present invention.

Referring to FIG. 3, the digital frequency demodulator according to the present invention is applicable to systems which require frequency modulation, such as ordinary audio and/or video systems, communication systems or a broadcasting systems.

This and other objects, features and advantages according to the present invention are provided by a frequency demodulating method in a frequency demodulator restoring a signal which has been frequency-modulated, the frequency demodulator receiving a frequency modulated signal and having a differentiator for differentiating a phase compensated signal, a subtractor for subtracting a carrier-frequency component from a differentiated phase compensated signal so as to cancel the carrier component from the differentiated phase compensated signal and a multiplier for multiplying the subtractor output signal by a reciprocal of a frequency-deviation-determining component to thereby cancel the frequency-deviation-determining component and generate a demodulated signal. The frequency demodulating method includes steps for:

(a) generating a delayed signal and a phase-shifted signal in response to the received modulated signal;

(b) comparing first and second values representing the delayed and phase-shifted signals, respectively, to thereby generate an address signal and a comparison signal;

(c) converting the address signal to a phase value;

(d) compensating the phase value in response to first and second slope signals representing the delayed and phase-shifted signals, respectively, and the comparison signal to thereby generate said phase-compensated signal.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENT

In FIG. 3, the digital frequency demodulator is equipped with an address generator 100 for generating the address information for a look-up table 120 by phase-shifting the frequency-modulated signal by a predetermined angle and comparing the magnitudes of the absolute values of the phase-shifted signal and frequency-modulated signal. The look-up table 120 stores frequency demodulation data corresponding to an address representing the results of a comparison with a frequency-modulated signal and a phase-shifted signal over a predetermined period. The frequency demodulator also includes first and second slope discriminators 130 and 140 for discriminating respective slopes of the phase-shifted signal and frequency-modulated signal, and a phase compensator 150 for expanding the range of the phase value output from look-up table 120 by operating in the phase value output from look-up table 120. Phase compensator 150 is responsive to the output phase value of look-up table 120, a predetermined phase value determined according to the slope discriminating signals of slope discriminators 130 and 140 and the comparison result signal produced by a comparator/selector 105 in address generator 100. Advantageously, a differentiator 160 for differentiating the compensated output signal, a subtractor 170 for subtracting a carrier-frequency-determining component K2, which component is chosen according to the kind of system to which the frequency demodulator is adopted and the size of the look-up table, from the signal output from differentiator 160 so as to cancel the carrier component from the signal differentiator output, and a multiplier 180 for multiplying the subtractor output signal by the reciprocal of a frequency-deviation-determining component K1 (which component is also chosen according to the same criteria as applied to component K2) so as to cancel the K1 component from the subtractor output signal, are also provided.

Address generator 100 consists of a delay 101 for delaying an input signal while it is processed in phase shifter 102, which phase shifts the input signal by a predetermined angle, connected to first and second absolute value processors 103 and 104 for obtaining the absolute values of the signals output from delay 101 and phase shifter 102, respectively. Preferably, a comparator/selector 105 for comparing and selecting the output signals of first and second absolute value processors 103 and 104, and a divider 106 for dividing the outputs of first and second absolute value processors 103 and 104 according to the comparison result signal of comparator/selector 105, are also included in address generator 100.

Figure 4A:
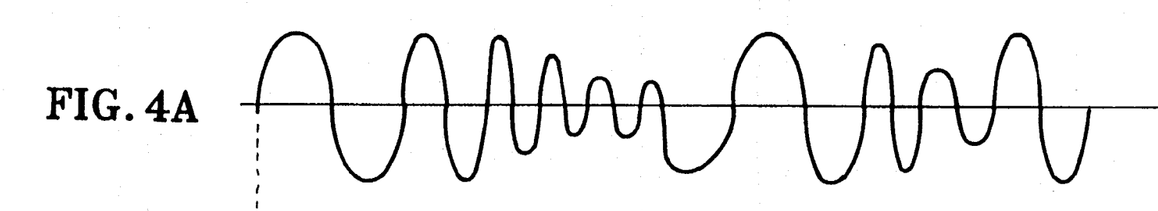
FIG. 4A is an example of the input of FIG. 3.
Figure 4B:
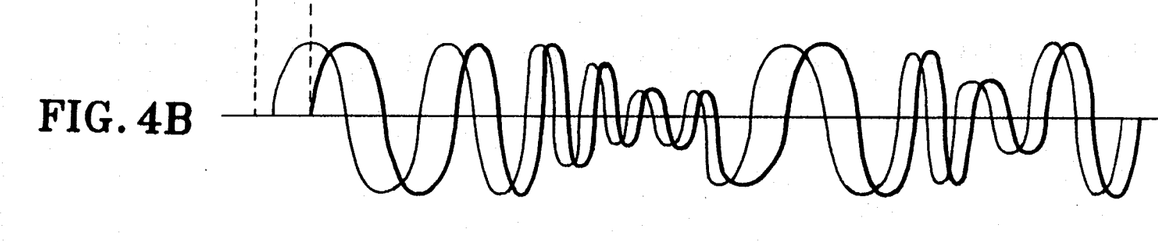
FIG. 4B illustrates the signals output from the delay and phase shifter of FIG. 3.
Figure 5:
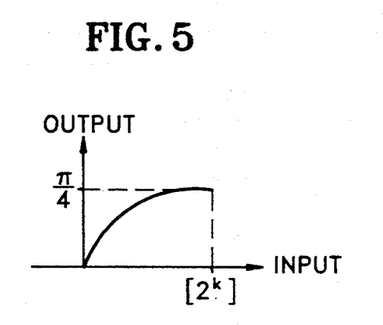
FIG. 5 shows a graphical representation of data stored in the look-up table of FIG. 3.
Figure 6A:
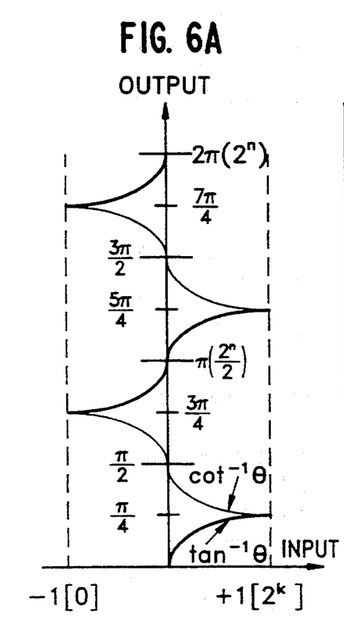
FIG. 6A and FIG. 6B illustrate graphical and tabular forms of data output from the phase compensator shown in FIG. 3.
Figure 6B:
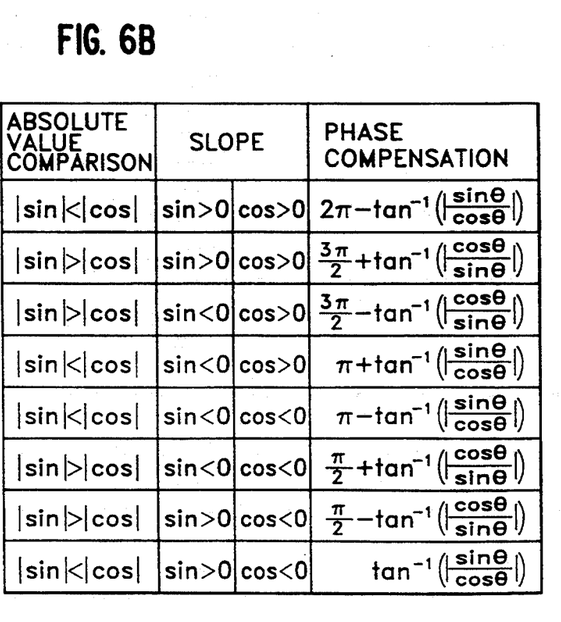

FIG. 4A illustrates the waveform of the frequency-modulated input signal applied to the circuitry of FIG. 3, while FIG. 4B illustrates the waveforms of the signals output from delay 101 and phase shifter 102. FIG. 5 illustrates the frequency demodulated data stored in look-up table 120 of FIG. 3, in the form of arc-tangent data from $0$–$1/4\pi$, and FIG. 6 shows operational expressions performed by phase compensator 150 of FIG. 3, which are represented in arc-tangent form. FIG. 6B illustrates the operational relationship between comparator/selector 105 and slope discriminators 130 and 140. Preferably, the output of look-up table 120 is k bits and the output of phase compensator 150 is n bits. In an exemplary case, k advantageously may be 7 or 8 bits while n may be 10 bits.

The operation of the digital frequency demodulator of FIG. 3 will be described with reference to FIG. 4A, FIG. 4B, FIG. 5, FIG. 6A and FIG. 6B.

First, in order to restore the signal frequency-modulated as shown in equations (4), (5) and (6) into the original signal, if the input signal is applied in the form of a sine wave as in FIG. 4A, phase shifter 102 delays the input signal for $-\pi/2$ in the same manner as that of the phase shifter 12 in FIG. 1, so as to output a cosine wave. Delay 101 delays the applied sine wave for a time during which it is processed in phase shifter 102, and outputs the sine wave at the same time that the cosine wave which has been phase-shifted by 90° in phase shifter 102, is output. Phase shifter 102 merely delays the phase of a signal while outputting its magnitude unchanged, e.g., by employing a Hilbert transform operation. These outputs, which are shown in FIG. 4B, are output to first and second absolute value processors 103 and 104 and first and second slope discriminators 130 and 140, respectively. Then, first and second absolute value processors 103 and 104 obtain the magnitudes of the absolute values of the sine wave output from delay 101 and the cosine waves output from phase shifter 102. The obtained magnitudes are input to comparator/selector 105 which compares the magnitudes of the absolute values of the sine wave and cosine wave output from first and second absolute value processors 103 and 104, and sends the comparison result to phase compensator 150. The comparator/selector 105 also sets the denominator and numerator for divider 106 such that the greater value is always divided by the lesser value. In an exemplary case, the upper and lower output terminals $T_1$ and $T_2$ of comparator/selector 105 always output the greater and lesser signals, respectively, to divider 106. Accordingly, divider 106 performs division and sends the result as the address of look-up table 120. Through this division operation, the amplitude-modulated component contained in the signal output from first and second absolute value processors 103 and 104 is canceled.

Look-up table 120 outputs a signal corresponding to the address signal output from divider 106. The look-up table may advantageously be composed of an ordinary ROM. The data stored in look-up table 120 is an arc-tangent value ranging from 0 to $\pi/4$, as shown in FIG. 5. The frequency demodulated data stored in look-up table 120 varies according to operational expression of phase compensator 150 and the size of ROM used in look-up table 120. Preferably, if the frequency demodulated data stored in look-up table 120 has a phase value between 0 and $\pi/2$, the look-up table is an eight-bit ROM. Moreover, if the stored frequency demodulated data has a phase value between 0 and $\pi/4$, the look-up table is a seven-bit ROM. The output signal of look-up table 120 is a phase component with respect to the magnitude of the input signal, and is fed to phase compensator 150.

Slope discriminators 130 and 140 discriminate the slopes of the sine wave output from delay 101 and the cosine wave output from phase shifter 102, that is, the state of increase or decrease of the output signal, and sends these results to phase compensator 150. Phase compensator 150 compensates for the phase of an input signal according to its magnitude, using the slope discrimination results of first and second slope discriminators 130 and 140, the absolute value comparison result of the output signals of first and second absolute value processors 103 and 104 from comparator/selector 105, and the output of look-up table 120. This is to compensate for the phase value of the data output from look-up table 120 to a corresponding phase value (0 to $2\pi$) shown in FIG. 6A and FIG. 6B because of the fact that the data ranges from 0 to $\pi/4$.

If the phase value output from look-up table 120 is $\tan^{-1}(\sin\theta/\cos\theta)$ and first and second slope discriminators 130 and 140 determine that $\sin\theta > 0$ and $\cos\theta < 0$, the phase value is determined to exist between 0 and $\pi/4$ (the first quadrant) so that phase compensator 150 performs the operation $0 + \tan^{-1}(|\sin\theta/\cos\theta|)$. If the first and second slope discriminators signify that $\sin\theta < 0$ and $\cos\theta < 0$, the phase value is determined to exist between $3\pi/4$ and $\pi$ (the second quadrant) so that phase compensator 150 performs the operation $\pi - \tan^{-1}(|\sin\theta/\cos\theta|)$. Likewise, $\sin\theta < 0$ and $\cos\theta > 0$ identifies the phase value as existing between $\pi$ and $5\pi/4$ (the third quadrant) so that phase compensator 150 performs the operation $\pi + \tan^{-1}(|\sin \theta/\cos \theta|)$. For $\sin \theta > 0$ and $\cos \theta > 0$, the phase value is determined to exist between $7\pi/4$ and $2\pi$ (the fourth quadrant) so that phase compensator 150 performs the operation $2\pi - \tan^{-1}(|\sin \theta/\cos \theta|)$.

Then, differentiator 160 differentiates the signal output from phase compensator 150 so as to restore the signal integrated during the frequency modulation. Next, subtractor 170 subtracts the carrier frequency (K2) of the signal output from differentiator 150 so as to cancel the carrier frequency to 2.

Here, the carrier frequency is the same as that used during the frequency modulation. In an exemplary case for a frequency demodulator employed in a camcorder, the carrier frequency can be obtained as follows. With a carrier frequency of 4.2–5.4 MHz (from the sync tip to 100% of white level), a system sampling clock of 27 MHz and the look-up table having 8-bit address data and 10-bit output data, the maximum deviation is $(5.4/27) \times 1024$ or 204.8 and the minimum deviation is $(4.2/270) \times 1024$ or 159.29.

Accordingly, from equation (6), it can be said that $$K2 + x(iT)K1 = 204.8 \quad (9)$$

$$K2 + x(iT)K1 = 159.29 \quad (10)$$

given that $x(iT)$ is 127. Thus, the K1 and K2 values can be obtained using these equations.

When the signal without the K2 component is output from subtractor 170, multiplier 180 multiplies the applied signal by 1/K1 (the reciprocal of frequency-deviation-determining component K1), so as to cancel the K1 component. Then, low-pass filter 190 removes the high frequency component contained in the signal output from multiplier 180, to restore the original signal and, thus, output the frequency demodulated signal.

As described above, during frequency demodulation, when data to be demodulated is prestored in the look-up table and signal processing is digitally performed so as to generate a read address required for reading the data of the look-up table using a phase shift method, the present invention phase-compensates by discriminating the slope degree of a frequency-modulated signal containing a signal which does not cross the zero axis, thereby enhancing the precision of the frequency demodulation and minimizing the frequency demodulation data stored in the look-up table, which reduces the necessary capacity of the ROM used for the look-up table as compared with conventional digital signal processing.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A frequency demodulator for restoring a signal which has been frequency-modulated in order to perform a write operation or transmission, comprising:

a look-up table for storing frequency demodulation data used to output a phase value which is shifted according to a change in a frequency-modulated signal;

address generating means for phase-shifting said frequency-modulated signal by a predetermined angle and comparing the magnitude of the absolute value of said phase-shifted signal and the magnitude of the absolute value of said frequency-modulated signal so as to generate address information for said look-up table;

a slope discriminator for discriminating respective slopes of said phase-shifted signal and said frequency-modulated signal and outputting a slope discriminating signal in accordance therewith;

a phase compensator for operating on the phase value output from the look-up table by a predetermined phase value according to said slope discriminating signal and the comparison result of said magnitude of said absolute value of said phase-shifted signal of said address generating means and said magnitude of said absolute value of said frequency-modulated signal, so as to expand said phase value output from said look-up table;

a differentiator for differentiating a respective signal output from said phase compensator;

a subtractor for subtracting a carrier-frequency-determining component from a respective signal output from said differentiator so as to cancel a carrier component from a respective signal output from said differentiator; and a multiplier for multiplying a respective signal output from said subtractor by a reciprocal value representing a frequency-deviation-determining component, to thereby cancel the frequency-deviation-determining component.

2. The frequency demodulator as claimed in claim 1, wherein said frequency demodulation data stored in said look-up table is said phase value, which is expressed by a range of values between 0 and $\pi/4$ in an arc-tangent component form.

3. The frequency demodulator as claimed in claim 2, wherein said address generating means comprises:

a phase shifter for shifting said phase of said frequency-modulated signal by 90°;

a delay for delaying said frequency-modulated signal for a respective phase-shift period;

an absolute value processor for producing said absolute values of respective signals output from said phase shifter and from said delay;

a comparator/selector for comparing respective output signals of said absolute value processor and for selecting the greater value between said respective output signals; and a divider controlled according to a result of said comparator/selector, for dividing said absolute value of said frequency modulated signal with said absolute value of said phase-shifted signal.

4. The frequency demodulator as claimed in claim 3, wherein, if said absolute value of said frequency modulated signal from said delay is greater than that of said phase-shifted signal from said phase shifter, said comparator/selector applies respective signals to said divider such that the respective output of said phase shifter is divided by the respective output of said delay, and if said absolute value of said frequency-modulated signal from said delay is less than or equal to that of said phase-shifted signal from said phase shifter, said comparator/selector applies said respective signals to said divider such that the respective output of said delay is divided by the respective output of said phase shifter.

5. The frequency demodulator as claimed in claim 4, wherein, when a divided signal output by said divider is input to said look-up table as an address, said phase value expressing said address in arc-tangent form is output to said phase compensator.

6. The frequency demodulator as claimed in claim 1, wherein, if said frequency-modulated signal is positive and said phase-shifted signal is negative, said slope discriminator determines that said frequency-modulated signal is in a first quadrant, if said frequency-modulated signal and said phase-shifted signal are both negative, said slope discriminator determines that said frequency modulated signal is in a second quadrant, if said frequency-modulated signal is negative and said phase-shifted signal is positive, said slope discriminator determines that said frequency modulated signal is in a third quadrant, and if said frequency-modulated signal and said phase-shifted signal are both positive, said slope discriminator determines that said frequency-modulated signal is in a fourth quadrant.

7. A frequency demodulator for restoring a signal which has been frequency-modulated, the frequency demodulator receiving a frequency modulated signal and having a differentiator for differentiating a phase compensated signal, a subtractor for subtracting a carrier-frequency component from a differentiated phase compensated signal so as to cancel the carrier component from the differentiated phase compensated signal and a multiplier for multiplying the subtractor output signal by a reciprocal of a frequency-deviation-determining component to thereby cancel the frequency-deviation-determining component and generate a demodulated signal, said frequency demodulator comprising:

memory means for storing frequency demodulation data used to output a phase value which is shifted according to a change in said frequency-modulated signal;

address generating means for phase-shifting said frequency-modulated signal by a predetermined angle to produce a phase-shifted signal and for comparing absolute value magnitudes of said phase-shifted and said frequency-modulated signals so as to generate address information for said memory means and a comparison signal;

slope determining means for determining first and second slopes of respective said frequency-modulated and said phase-shifted signals and for producing first and second slope determination signals;

compensator means for operating on said phase value responsive to said first and said second slope determination signals and said comparison signal so as to expand said phase value output from said memory means to thereby produce said phase compensated signal.

8. The frequency demodulator as claimed in claim 7, wherein said frequency demodulation data stored in said memory means is a phase value expressed by a range of value between 0 and $\pi/4$ in arc-tangent component form.

9. The frequency demodulator as claimed in claim 7, wherein said address generating means comprises:

a phase shifter for shifting the phase of said frequency-modulated signal by 90° to produce said phase-shifted signal;

a delay for delaying said frequency-modulated signal for a predetermined time period corresponding to a respective phase-shift period to thereby produce a delayed signal;

an absolute value processor for producing said absolute value magnitudes responsive to said delayed and said phase-shifted signals;

a comparator/selector for comparing said absolute value magnitudes and for ordering said absolute value magnitudes; and a divider responsive to the ordered said absolute value magnitudes provided by said comparator/selector, for dividing said delayed signal with said phase-shifted signal to thereby produce said address information.

10. The frequency demodulator as claimed in claim 9, wherein, when said absolute value magnitude of said delayed signal is greater than that of said phase-shifted signal, said comparator/selector permits said divider to divide said absolute value of said phase shifted signal by said absolute value of said delayed signal, and when said absolute value magnitude of said delayed signal is less than or equal to that of said phase-shifted signal, said comparator/selector permits said divider to divide said absolute value of delayed signal by said absolute value of phase-shifted signal.

11. The frequency demodulator as claimed in claim 10, wherein said phase value corresponding to said address information is expressed in arc-tangent form.

12. The frequency demodulator as claimed in claim 7,
wherein, when said frequency-modulated signal is positive and said phase-shifted signal is negative, said slope determining means determines that said frequency-modulated signal is in a first quadrant, wherein, when said frequency-modulated and said phase-shifted signals are both negative, said slope determining means determines that said frequency modulated signal is in a second quadrant, wherein, when said frequency-modulated signal is negative and said phase-shifted signal is positive, said slope determining means determines that said frequency modulated signal is in a third quadrant, and wherein, when said frequency-modulated and said phase-shied signals are both positive, said slope determining means determines that said frequency-modulated signal is in a fourth quadrant.

13. In a frequency demodulator for restoring a signal which has been frequency-modulated, the frequency demodulator receiving a frequency modulated signal and having a differentiator for differentiating a phase compensated signal, a subtractor for subtracting a carrier-frequency component from a differentiated phase compensated signal so as to cancel the carrier component from the differentiated phase compensated signal and a multiplier for multiplying the subtractor output signal by a reciprocal of a frequency-deviation-determining component to thereby cancel the frequency-deviation-determining component and generate a demodulated signal, a frequency demodulating method comprising the steps of:

(a) generating a delayed signal and a phase-shifted signal in response to a received said modulated signal;

(b) comparing first and second values representing said delayed and said phase-shifted signals, respectively, to thereby generate an address signal and a comparison signal;

(c) converting said address signal to a phase value;

(d) compensating said phase value in response to first and second slope signals representing said delayed and said phase-shied signals, respectively, and said comparison signal to thereby generate said phase-compensated signal.

14. The frequency demodulation method as claimed in claim 13, further comprising a step (e) for storing frequency demodulation data used to output said phase value which said phase value is shifted according to a change in said frequency-modulated signal, wherein said step (e) is performed prior to performing said step (a).

15. The frequency demodulation method as claimed in claim 14, wherein said frequency demodulation data corresponds to phase values ranging between 0 and $\pi/4$ expressed in arc-tangent component form.

* * * * *